United States Patent [19]

Mills

[11] 3,870,964

[45] Mar. 11, 1975

[54] SOUND VOLUME CONTROL CIRCUIT WITH SOUND LEVEL OUTPUT LINEARLY RELATED TO VOLUME CONTROL POTENTIOMETER SETTING

[75] Inventor: Thomas B. Mills, Sunnyvale, Calif.

[73] Assignee: National Semiconductor Corporation, Santa Clara, Calif.

[22] Filed: July 16, 1973

[21] Appl. No.: 379,747

[52] U.S. Cl. .................................. 330/29, 330/30 D

[51] Int. Cl. ............................................... H03g 3/30

[58] Field of Search ..................... 330/29, 30 D, 145; 325/319, 415

[56] References Cited

FOREIGN PATENTS OR APPLICATIONS 1,236,928 6/1971 Great Britain ........................ 330/29

OTHER PUBLICATIONS

Liu, "Differential Variable-Gain Amplifier," IBM Technical Disclosure Bulletin, Vol. 15, No. 5, Oct. 1972, pp. 1444–1445.

*Primary Examiner*—James B. Mullins

[57] ABSTRACT

An integrated circuit sound level control wherein a resistance potentiometer is utilized to produce a voltage output linearly related to the potentiometer setting, the voltage output serving to produce a current in a differential amplifier which is linearly related to the potentiometer voltage, the linear current of the differential amplifier being converted by a diode circuit coupled thereto into a log function voltage, the log function voltage serving to drive a transistor in an attenuator circuit coupled between the audio signal input stage and the audio signal output, said transistor responding to said log function signal drive to produce a change in the audio signal output linearly related to said potentiometer voltage. Temperature compensation is included in the circuit.

3 Claims, 3 Drawing Figures

SOUND VOLUME CONTROL CIRCUIT WITH SOUND LEVEL OUTPUT LINEARLY RELATED TO VOLUME CONTROL POTENTIOMETER SETTING

BACKGROUND OF THE INVENTION

Sound reproduction systems presently used, for example in television systems, employ integrated circuits on a semiconductor chip with a resistor potentiometer coupled to the IC circuitry for sound volume control. With a linear resistance type of potentiometer, the linear change in resistance with rotation or sliding movement of the potentiometer does not produce the desired linear change in the volume of the sound because the response of the integrated circuitry to the linear resistance change is not linear. To overcome this problem, resort is made to tapered type potentiometers wherein the resistance change is not linear with rotation of the potentiometer, this non-linear resistance change resulting in a more linear sound change for linear distance travel of the potentiometer.

However, it is difficult to fabricate such tapered potentiometers, and, in addition, such potentiometers vary one from the other and give different results with similar sound circuits. Therefore the results are not uniform from one television set to another, or in replacing the potentiometer of a set with a new potentiometer. Also, the known circuits are not temperature compensated and, since the sound chip also incorporates an audio power amplifier, the heat generated in use tends to change the level of the output sound relative to particular potentiometer settings.

SUMMARY OF THE PRESENT INVENTION

The present invention provides a linearizing circuit in the integrated circuit sound reproduction system which serves to convert the linear resistance change of a potentiometer to linear sound level changes. The linear output of the potentiometer is converted in a first circuit to a linear current which is converted in a second circuit to a log function voltage. The log function voltage in turn is converted to a linear current in the sound attenuator circuit which operates to produce a linear change in the audio output level from the integrated circuit.

In a preferred embodiment of the invention the linear output of the potentiometer is coupled to a differential amplifier which provides a linear current output responsive to the variable potentiometer. This linear current output is converted by diode circuitry to a log function at the base circuits of the two transistors in a differential amplifier attenuator circuit through which the audio signal is directed, the log function base input being converted to linear current changes of the audio signal output from the attenuator. A resistor circuit is included in the integrated circuit to provide temperature compensation for the audio circuitry.

DESCRIPTION OF THE PREFERRED EMBODIMENTS

Figure 1:
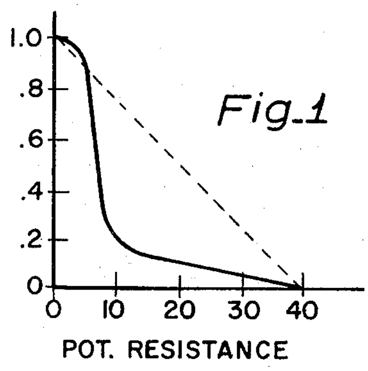
FIG. 1 illustrates the tuning characteristics of a linear resistance potentiometer in a known form of an audio tuning system.

Referring now to FIG. 1 there is shown a plot of the tuning characteristic of a linear potentiometer used for volume control in the known form of audio tuning circuit, with the resistance of the potentiometer plotted along the abscissa and the volume of the output sound plotted along the ordinate. From this plot it can be seen that the sound volume changes very rapidly and over a large range in less than one quarter of the potentiometer resistance, i.e., between 0 and 10K resistance, whereas the sound volume changes little for large resistance changes at the higher end of the resistance of the potentiometer. The ideal linear characteristic is shown by the dotted line.

Figure 2:
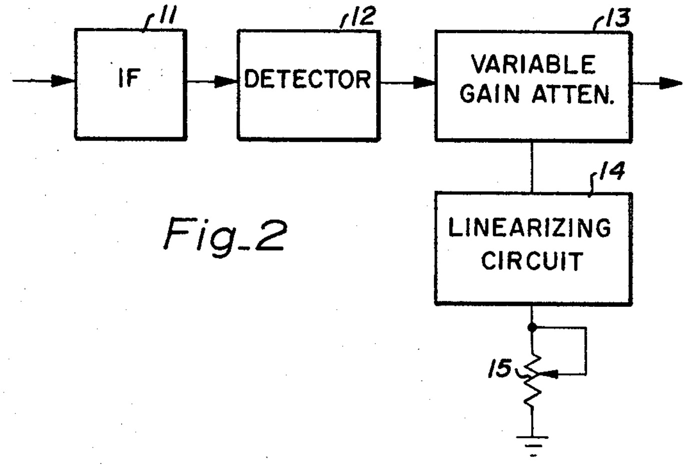
FIG. 2 is a block diagram of an audio tuning system incorporating the present invention.

As viewed in FIG. 2, the sound system of the present invention comprises the standard IF stage 11, detector stage 12 and sound attenuator stage 13, and, in addition, a linearizing circuit 14 between the linear type volume control potentiometer 15 and the attenuator 13. This system gives a tuning characteristic more nearly approaching the dotted line plot in FIG. 1.

Figure 3:
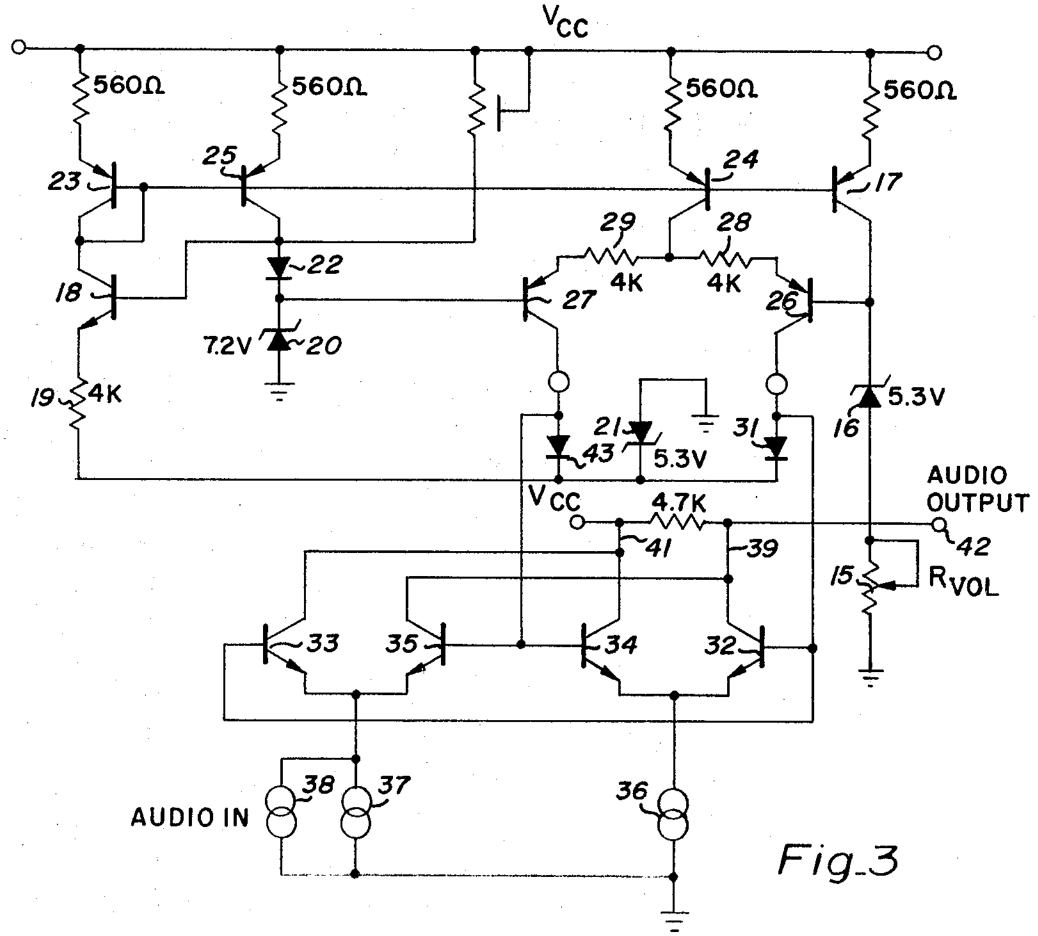
FIG. 3 is a schematic diagram of a preferred form of circuit incorporating the present invention.

This linearizing circuit is shown in detail in the schematic diagram of FIG. 3 where the potentiometer 15 is shown in series circuit with a zener diode 16 providing a 5.3V voltage drop and the current supply transistor 17 coupled to the supply rail $V_{CC}$.

In operation, the collector current flowing in the current supply transistor 18 is a function of the voltage established across the associated resistor 19 in the emitter circuit. This voltage is the difference between the zener voltage across zener 20 (7.2V) and the zener voltage across zener 21 (5.3V). The voltage drop across the diode 22 serves to offset the base-emitter voltage drop at transistor 18. The collector current flowing in transistor 18 forces a collector current in transistor 23, which is connected for operation as a diode tied to current supply transistors 17, 24 and 25. Since the current gain of these transistors is high and they are well matched on the integrated circuit chip, all have equal base-emitter voltages and their collector currents are substantially equal.

With the movable tap of the potentiometer 15 positioned at the grounded end thereof, the voltage at the base of transistor 26 in the differential amplifier comprising transistors 26 and 27 is the voltage across the zener diode 16, in this example 5.3V. Since this voltage is lower than the voltage from zener diode 20 applied to the base of transistor 27, transistor 26 turns on and transistor 27 turns off, and collector current flows in transistor 26 from the current supply transistor 24. With a sufficiently high resistance value for the resistor 28, for example 4K, which is also the value for resistor 29 in the emitter circuit of transistor 27, the collector current flowing in transistor 26 is linearly related to the voltage on its base which in turn is linearly related to the potentiometer voltage.

This current flows through the diode 31 which establishes a voltage on the bases of the two transistors 32 and 33, turning these two transistors on.

The four transistors 32, 33, 34 and 35 form a differential amplifier attenuator circuit comprising a basic multiplier double-balanced circuit with the emitters of transistors 32 and 34 coupled to a DC bias current source 36 and with the emitters of the transistors 33 and 35 coupled to a DC bias current source 37 and to the incoming audio signal from source 38 including the detector 12 of FIG. 1. This double balanced circuit insures that the DC bias current from sources 36 and 37 divide equally in the collector circuits 39 and 41 during tuning while the audio current from the source 38 will divide between the two collector circuits 39 and 41 responsive to the tuning by the volume control 15.

The voltage across the diode 31 is a log function of the collector current flowing in transistor 26, and this log function voltage applied across the base-emitter circuit of transistor 33 produces a linear collector current flow in this transistor. Since all of the audio current flows in the collector circuit of transistor 33 while no current is flowing in the collector circuit of transistor 35, no audio signal appears at the output terminal 42.

As the potentiometer tap is moved to linearly add resistance into the collector circuit of transistor 17, the voltage at the base of transistor 26 increases and causes a linear decrease in the collector current of transistor 26 and the initiation of a linear current flow in transistor 27. As the resistance of the volume control increases, more current flows in transistor 27 and less current flows in transistor 26 until, at maximum resistance, transistor 26 is turned off and transistor 27 is turned full on.

As the current in transistor 27 increases, a voltage drop occurs across the diode 43 which is a log function of this collector current, and this log function across the base-emitter circuit of transistor 35 causes a linear increase in the collector current flowing therein. Thus, as the voltage applied to the base of transistor 35 increases while the voltage applied to the base of transistor 33 decreases, more audio signal current flows in the collector circuit 39 while less current flows in the collector circuit 41 so that the level of the sound volume output on terminal 42 increases.

Thus a linear voltage change at the bases of transistors 26 and 27 results in linear current flow in the collectors of these transistors. These linear currents are converted to log function voltages at the bases of the attenuator transistors 33 and 35, these log function voltages across the base-emitter circuits resulting in linear collector currents in the attenuator and thus linear changes in the output sound level.

If the zener voltage of diode 20 tends to or becomes high in value with respect to the zener voltages of diodes 16 and 21, it is desired that, to maintain the same level of volume with potentiometer setting, the collector current flowing through transistor 17 be increased. This result is achieved by resistor 19 formed on the chip since this resistor controls the setting of the current flow in the current supply transistors 17, 24 and 25 and thus compensates for zener voltage changes as may occur from chip to chip or with changes in temperature.

What is claimed is:

1. A sound volume control system comprising:

an attenuator circuit for controlling the level of transmission of an incoming audio signal to an audio signal output, said attenuator circuit comprising:

a pair of transistors, the emitter-collector circuits of said transistors being coupled in parallel and being coupled to receive said incoming audio signal, one of said emitter-collector circuits having said audio output coupled thereto, a potentiometer for producing a linear voltage output change responsive to movement thereof, first circuit means responsive to said linear voltage change from said potentiometer for producing a current change linearly related to said voltage change, said first circuit means comprising:

a differential amplifier including a pair of transistors, and means for applying a reference voltage to the base of one of said latter transistors, said voltage from said potentiometer being applied to the base of the other of said latter transistors, second circuit means for converting said linear current change to a log function change, said second circuit means comprising:

diodes in each of the emitter-collector circuits of said differential amplifier transistors, said diodes being coupled to the bases of said transistors in said attenuator circuit, and third circuit means in said attenuator circuit for converting said log function voltage change to a changing audio signal current flow to said audio output linearly related to said potentiometer voltage change.

2. A sound system as claimed in claim 1 including a current source coupled to the emitter-collector circuits of said differential amplifier transistors, a pair of resistors, each emitter-collector circuit of said differential amplifier containing one of said resistors, and a fourth circuit means including a third resistor for setting the level of the current flow from said current source to said differential amplifier.

3. A sound system as claimed in claim 2 including a second current source coupled to said means for applying the reference voltage to the base of said one transistor in said first circuit, and a third current source coupled to said potentiometer, said fourth circuit means serving to set the current levels from said second and third current sources.

* * * * *